United States Patent
Nakano et al.

(10) Patent No.: US 11,996,374 B2
(45) Date of Patent: May 28, 2024

(54) EXTERNAL CONNECTOR OF SEMICONDUCTOR MODULE, METHOD FOR MANUFACTURING EXTERNAL CONNECTOR OF SEMICONDUCTOR MODULE, SEMICONDUCTOR MODULE, VEHICLE, AND METHOD FOR CONNECTING EXTERNAL CONNECTOR TO BUS BAR

(71) Applicant: FUJI ELECTRIC CO., LTD., Kanagawa (JP)

(72) Inventors: Hayato Nakano, Kofu (JP); Shun Sakai, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 770 days.

(21) Appl. No.: 16/794,228

(22) Filed: Feb. 19, 2020

(65) Prior Publication Data

US 2020/0388937 A1  Dec. 10, 2020

(30) Foreign Application Priority Data

Jun. 7, 2019  (JP) .................................. 2019-106886

(51) Int. Cl.
| | | |
|---|---|---|
| *H01L 23/00* | (2006.01) | |
| *B60K 1/00* | (2006.01) | |
| *H01L 23/50* | (2006.01) | |
| *H01R 4/62* | (2006.01) | |
| *H02K 11/33* | (2016.01) | |

(52) U.S. Cl.
CPC .............. *H01L 24/00* (2013.01); *H01L 23/50* (2013.01); *H01R 4/62* (2013.01); *H02K 11/33* (2016.01); *B60K 1/00* (2013.01); *H01R 2201/26* (2013.01)

(58) Field of Classification Search
CPC ........ H01L 24/00; H01R 4/62; H01R 2201/26
See application file for complete search history.

(56) References Cited

U.S. PATENT DOCUMENTS

| | | | | |
|---|---|---|---|---|
| 4,694,322 A | * | 9/1987 | Sakurai ................... | H01L 23/40 |
| | | | | 257/E23.083 |
| 5,373,105 A | * | 12/1994 | Nagaune .................. | H01L 23/04 |
| | | | | 429/170 |
| 5,763,946 A | | 6/1998 | Nakadaira | |
| | | | (Continued) | |

FOREIGN PATENT DOCUMENTS

| | | |
|---|---|---|
| JP | H0592971 U | 12/1993 |
| JP | 10945831 A | 2/1997 |
| | (Continued) | |

OTHER PUBLICATIONS

Office Action issued for counterpart Japanese Application No. 2019-106886, issued by the Japanese Patent Office dated Feb. 21, 2023 (drafted on Feb. 16, 2023).

*Primary Examiner* — Jeffrey T Carley
*Assistant Examiner* — Jose K Abraham

(57) ABSTRACT

External connection reliability is improved with an external connector including an external connection terminal, and a nut provided on a bottom surface side of the external connection terminal. The external connection terminal has a conductor, a first metal layer provided on an upper surface of the conductor, a second metal layer provided on the first metal layer, and a bottom surface metal layer provided on a bottom surface of the conductor.

14 Claims, 10 Drawing Sheets

(56) References Cited

U.S. PATENT DOCUMENTS

| | | | | |
|---|---|---|---|---|
| 6,122,170 | A * | 9/2000 | Hirose | C04B 37/026 174/16.3 |
| 6,399,220 | B1 * | 6/2002 | Abys | C25D 3/12 428/929 |
| 6,403,234 | B1 * | 6/2002 | Kodama | C25D 5/12 439/886 |
| 6,521,983 | B1 | 2/2003 | Yoshimatsu | |
| 6,613,451 | B1 * | 9/2003 | Asahara | C25D 5/505 428/929 |
| 9,065,124 | B2 * | 6/2015 | Imanaga | H01M 50/51 |
| 9,390,987 | B2 * | 7/2016 | Oose | H01L 24/01 |
| 9,559,464 | B2 * | 1/2017 | Yang | H01R 13/641 |
| 2002/0062973 | A1 * | 5/2002 | Yamada | H01L 24/49 257/E23.14 |
| 2004/0104113 | A1 * | 6/2004 | Tomita | H01L 24/81 204/290.01 |
| 2007/0167087 | A1 * | 7/2007 | Tamm | H01R 11/09 439/798 |
| 2014/0346659 | A1 * | 11/2014 | Nakamura | H01L 23/36 438/107 |
| 2015/0024643 | A1 * | 1/2015 | Petrucci | H01R 13/03 439/887 |
| 2015/0086867 | A1 * | 3/2015 | Oda | H01M 50/522 29/623.5 |
| 2016/0118641 | A1 * | 4/2016 | Oda | H01M 50/55 429/211 |
| 2016/0322726 | A1 * | 11/2016 | Kadoguchi | H01R 13/05 |
| 2016/0351883 | A1 * | 12/2016 | Lemke | H01M 10/486 |
| 2017/0298493 | A1 * | 10/2017 | Mennucci | B23K 20/02 |
| 2017/0365583 | A1 * | 12/2017 | Im | H01L 21/565 |
| 2019/0119801 | A1 | 4/2019 | Oda | |
| 2019/0131609 | A1 | 5/2019 | Fukushima | |
| 2019/0296309 | A1 * | 9/2019 | Yang | H01M 50/209 |

FOREIGN PATENT DOCUMENTS

| | | | |
|---|---|---|---|
| JP | 2002076255 | A | 3/2002 |
| JP | 2002324819 | A | 11/2002 |
| JP | 2009266872 | A | 11/2009 |
| JP | 2010098036 | A | 4/2010 |
| JP | 2011009707 | A | 1/2011 |
| JP | 2015069953 | A * | 4/2015 |
| JP | 2015130268 | A | 7/2015 |
| JP | 6210482 | B2 | 10/2017 |
| JP | 2017188386 | A | 10/2017 |
| JP | 6448388 | B2 | 1/2019 |
| WO | 2018173586 | A1 | 9/2018 |
| WO | 2018221087 | A1 | 12/2018 |

* cited by examiner

EXTERNAL CONNECTOR OF SEMICONDUCTOR MODULE, METHOD FOR MANUFACTURING EXTERNAL CONNECTOR OF SEMICONDUCTOR MODULE, SEMICONDUCTOR MODULE, VEHICLE, AND METHOD FOR CONNECTING EXTERNAL CONNECTOR TO BUS BAR

The contents of the following Japanese patent application are incorporated herein by reference:
NO. 2019-106886 filed in JP on Jun. 7, 2019

BACKGROUND

1. Technical Field

The present invention relates to an external connector of a semiconductor module, a method for manufacturing the external connector of the semiconductor module, a semiconductor module, a vehicle, and a method for connecting the external connector to a bus bar.

2. Related Art

Conventionally, there is known a semiconductor module that is connected to the outside through an external connection terminal and inputs or outputs main power (for example, see PTL 1).

PATENT LITERATURE

[PTL 1] Japanese Unexamined Patent Application Publication No. 2010-098036

SUMMARY

According to an embodiment of the present invention, provided is an external connector of a semiconductor module with improved reliability of external connection.

In order to solve the problem described above, in a first aspect of the present invention, provided is an external connector of a semiconductor module. The external connector of the semiconductor module includes an external connection terminal, and a nut provided on a bottom surface side of the external connection terminal, wherein the external connection terminal has a conductor, a first metal layer provided on an upper surface of the conductor, a second metal layer provided on the first metal layer, and a bottom surface metal layer provided on a bottom surface of the conductor.

The first metal layer may have a higher hardness than the second metal layer.

The first metal layer may be formed of the same material as the bottom surface metal layer.

The conductor may have a thickness that is 1.0 mm or more and 7.0 mm or less, the first metal layer may have a thickness that is 0.1 µm or more and 10 µm or less, the second metal layer may have a thickness that is 0.1 µm or more and 10 µm or less, and the bottom surface metal layer may have a thickness that is equal to or greater than that of the first metal layer.

The conductor is formed of copper or copper alloy, the first metal layer and the bottom surface metal layer are glossy nickel layers, and the second metal layer is a gold layer, a dull nickel layer, a copper tin alloy layer, or a silver layer.

The second metal layer may be provided so as to cover a part of the first metal layer.

The outer diameter of the nut may be equal to or less than a maximum diameter of a screw that corresponds to the nut.

The nut may be integrated with a housing of the semiconductor module.

The nut may be a flange-shaped nut having a flange on the external connection terminal side.

In a second aspect of the present invention, provided is a method for manufacturing an external connector of a semiconductor module. The method for manufacturing the external connector of the semiconductor module includes providing an external connection terminal, and providing a nut on a bottom surface side of the external connection terminal, wherein providing the external connection terminal includes providing a conductor, providing a first metal layer on an upper surface of the conductor, providing a second metal layer on the first metal layer, and providing a bottom surface metal layer on a bottom surface of the conductor.

Providing the external connection terminal may include forming an external connection terminal having a shape that convexly curves toward an upper surface side.

In a third aspect of the present invention, provided is a semiconductor module. The semiconductor module includes the external connector according to the first aspect of the present invention.

In a fourth aspect of the present invention, provided is a vehicle. The vehicle includes the semiconductor module according to the third aspect of the present invention.

In a fifth aspect of the present invention, provided is a method for connecting an external connector to a bus bar. The connecting method includes disposing the bus bar on an upper surface side of the external connection terminal, inserting a thread portion of a screw through a hole of the bus bar and a screw hole of the external connection terminal, and causing an end portion of the nut to cut into the bottom surface metal layer by tightening the screw.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all the combinations of features described in the embodiments are essential for the solving means of the invention.

In the present description, one side in a direction parallel to the depth direction of the semiconductor module is referred to as "upper" and the other side is referred to as "bottom". Of the two main surfaces of the substrate, layer, or other member, one surface is referred to as the upper surface and the other surface is referred to as the bottom surface. The "upper" and "bottom" directions are not limited to the direction of gravity or the direction of attachment to a substrate or the like when the semiconductor chip is mounted.

Figure 1A:
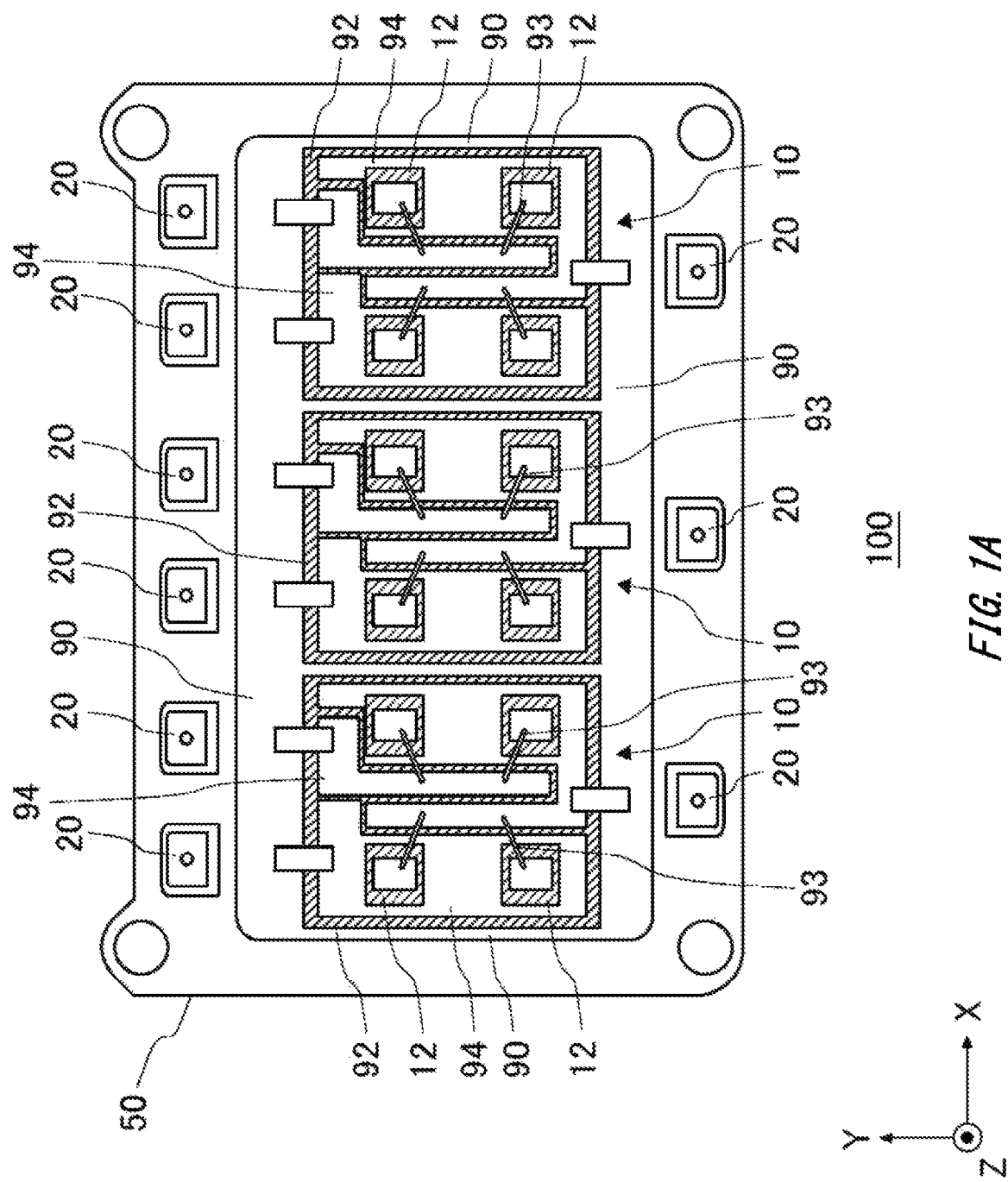
FIG. 1A is a schematic diagram of an upper surface of a semiconductor module 100 according to an embodiment of the present invention.

FIG. 1A is a schematic diagram of the upper surface of a semiconductor module 100 according to the embodiment of the present invention. The semiconductor module 100 includes a housing 50, a semiconductor cell 10 accommodated in the housing 50, and an external connector 20. In the present specification, the long side direction of the rectangular housing 50 in the top view of FIG. 1A is defined as the X axis, and the short side direction is defined as the Y axis. For example, the semiconductor module 100 is an intelligent power module (IPM). In addition, the direction that forms the right-handed system with respect to the X-axis direction and the Y-axis direction and is on the side having the semiconductor cell 10 in the semiconductor module 100 is the Z-axis direction. In addition, the top view means that the semiconductor module 100 is viewed from the positive direction of the Z axis.

The semiconductor cell 10 is an assembly including an insulating substrate and a plurality of semiconductor chips 12 disposed on top of the insulating substrate. The insulating substrate may include an insulating plate 92 and a circuit layer 94. The semiconductor cell 10 may further include a conductive member 93. The conductive member 93 is, for example, a wire, a ribbon, a clip, or the like. The insulating plate 92, the circuit layer 94, and the semiconductor chip 12 may be sequentially arranged along the Z-axis direction. The semiconductor chip 12 has switching devices such as a metal oxide field effect transistor (MOS-FET), an insulated gate bipolar transistor (IGBT), and a reverse conducting IGBT (RC-IGBT: Reverse-conducting IGBT). The RC-IGBT is a device that includes an IGBT and a free wheel diode (FWD) on the same chip. In addition, the semiconductor module 100 may be a three-phase inverter module having a U phase, a V phase, and a W phase. In the semiconductor cell 10, the circuit layer 94, the semiconductor chip 12, and the conductive member 93 may be electrically connected to form a half bridge circuit. The circuit layer 94 may be electrically connected to the external connector 20.

The main current of the semiconductor module 100 is input to or output from the external connector 20. The external connector 20 is electrically connected to the semiconductor chip 12. Whether the current is output from or input to the external connector 20 is set according to the purpose of use of the corresponding semiconductor module 100 and is not limited to either one. When the semiconductor module 100 is a three-phase inverter module, currents for driving the U phase, the V phase, and the W phase are input to and output from the external connector 20. The external connector 20 may function as a power supply terminal or a load terminal. The external connector 20 as a power supply terminal and the external connector 20 as a load terminal may be different in size and shape.

The housing 50 is molded from a resin such as a thermosetting resin that can be formed by injection molding, or a resin such as an ultraviolet curable resin that can be formed by UV molding. The resin for forming the housing 50 includes, for example, one or more polymeric materials selected from polyphenylene sulfide (PPS) resin, polybutylene terephthalate (PBT) resin, polyamide (PA) resin, acrylonitrile butadiene styrene (ABS) resin, acrylic resin, and the like.

A bottom plate 90 is provided beneath the insulating substrate on which the semiconductor chips 12 are installed. The bottom plate 90 may be a plate-like metal plate having a plane parallel to the XY plane. As an example, the bottom plate 90 is formed of a metal including aluminum, copper, and the like.

As an example, the insulating substrate may be a laminated substrate that includes, in the following order, the insulating plate 92 having an upper surface and a bottom surface, the circuit layer 94 provided on the upper surface of the insulating plate 92, and a metal layer (not shown) provided on the bottom surface. The insulating substrate may be, for example, a DCB (Direct Copper Bonding) substrate or an AMB (Active Metal Brazing) substrate. The insulating plate 92 may be formed using a ceramic material such as alumina ($Al_2O_3$), aluminum nitride (AlN), silicon nitride ($Si_3N_4$), or the like. The circuit layer 94 and the metal layer may be a plate material including a conductive material such as copper or copper alloy.

Figure 1B:
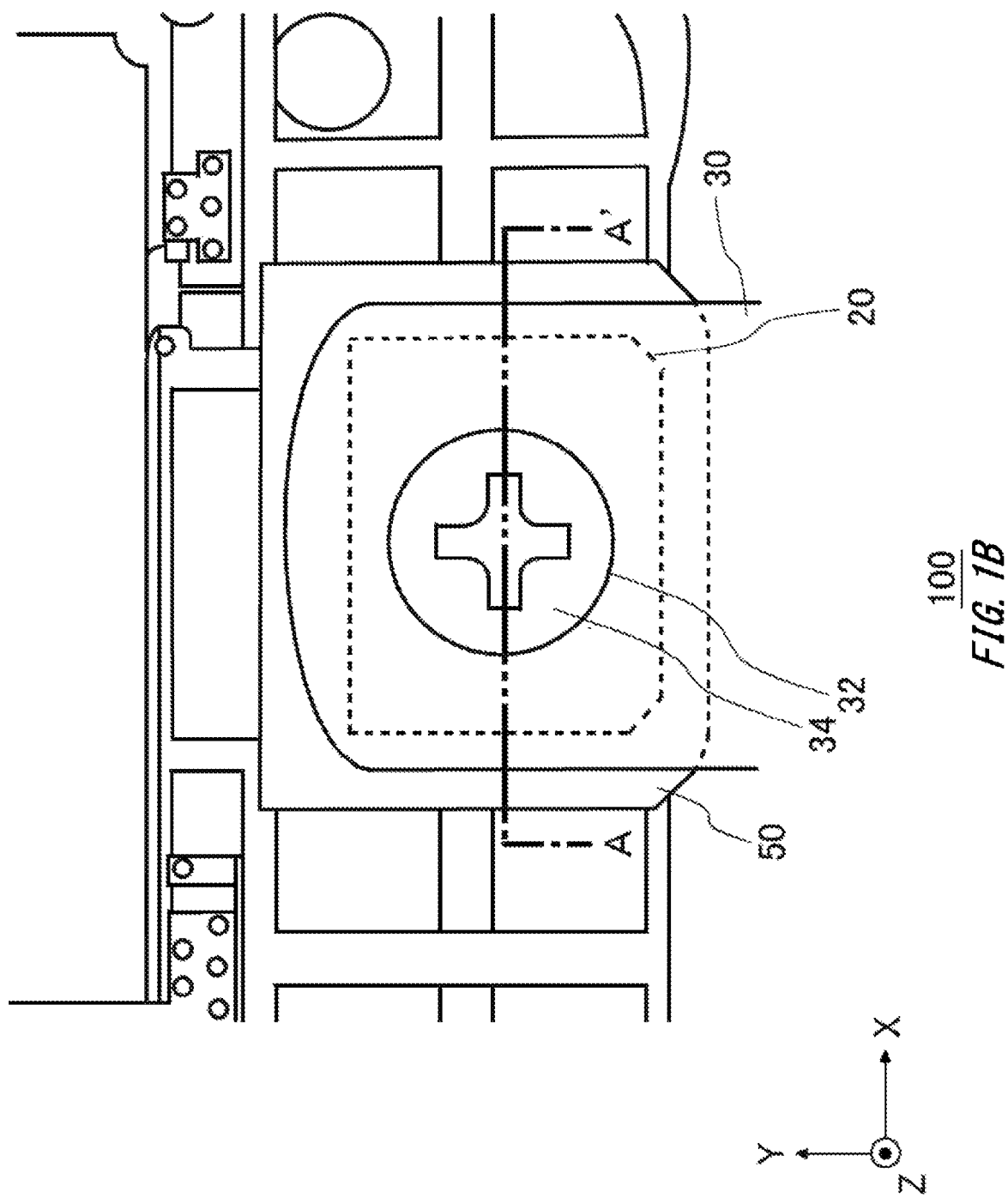
FIG. 1B is an enlarged top view of an external connector 20 according to the embodiment of the present invention.

FIG. 1B is an enlarged top view of the external connector 20 according to the embodiment of the present invention. Specifically, FIG. 1B shows the external connector 20 at the time of external connection. The external connector 20 is externally connected with the outside by a bus bar 30 and inputs/outputs the current to/from the outside. The term "at the time of external connection" refers to a state when the external connector 20 and the bus bar 30 stacked on the external connector 20 are fastened together with a screw 32. The external connector 20 is surrounded by the housing 50.

The bus bar 30 is a plate-like conductor. The bus bar 30 may be a plate-like member having conductivity and made of a metal such as copper or copper alloy. The bus bar 30 in the present example is formed in a size that covers the entire external connector 20 in the top view. The size of the bus bar 30 in the top view is not limited to this as long as it can be fastened together with the screws 32.

As an example, the bus bar 30 has a thickness of 5 mm or more. The bus bar 30 having such a thickness can supply power even when the semiconductor module 100 is a power module using a large current of 1200 A or more.

The screw 32 fastens the external connector 20 and the bus bar 30 together. The screw 32 has a screw head 34 and a thread portion 36. As an example, the screw head 34 has a circular shape in the top view. However, the shape of the screw head 34 is not limited to a circle, and may be a polygonal structure such as a hexagon. The screw head 34 is provided with a cross hole. The type of hole provided in the screw head 34 is not limited to a cross hole. As an example, the screw 32 may be an M4 screw to an M6 screw. The screw 32 may be formed of a metal selected from alloys of iron, copper, and aluminum, or may be formed of reinforced plastic.

Figure 1C:
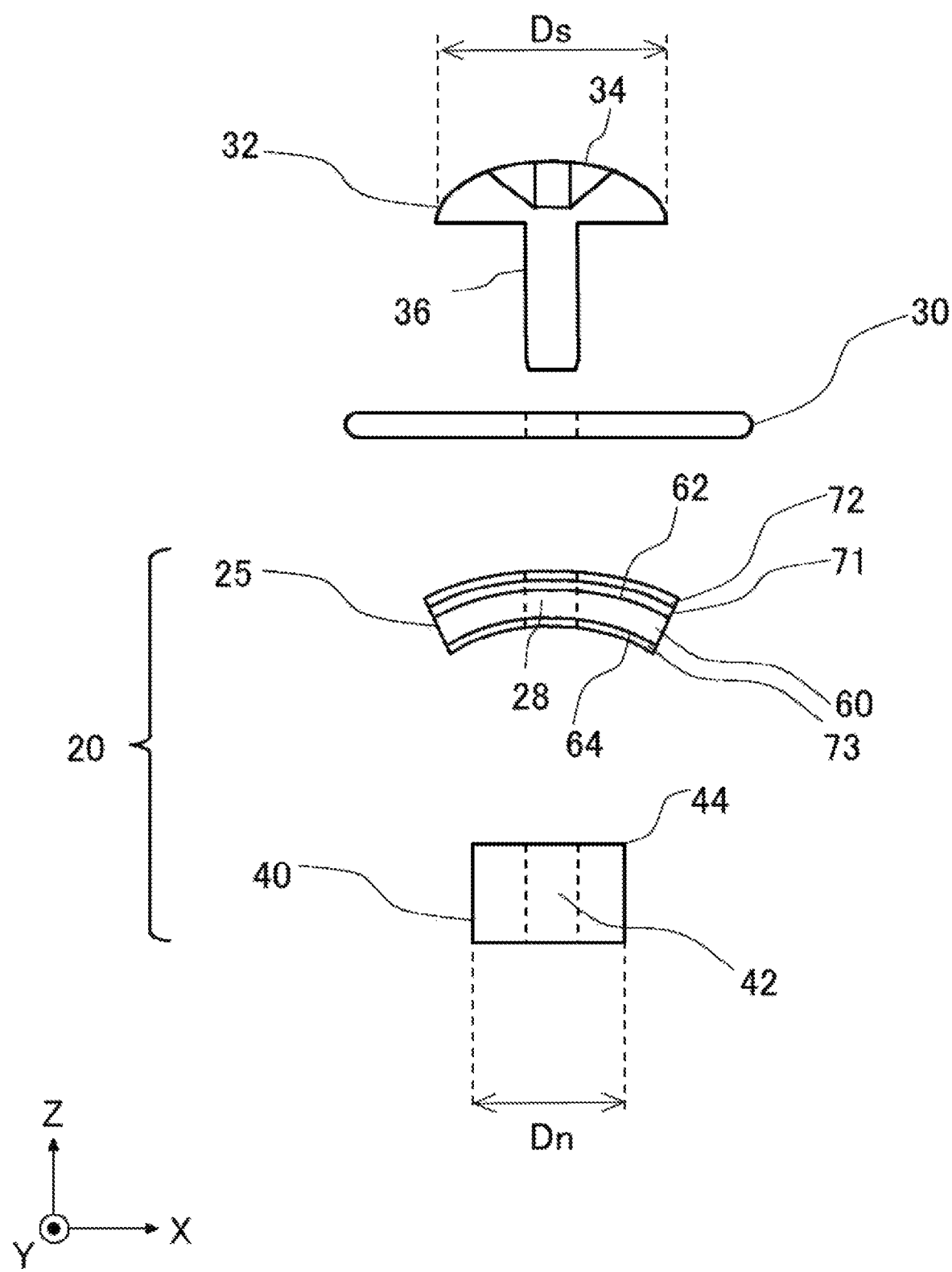
FIG. 1C is an exploded cross-sectional view of the external connector 20 according to the embodiment of the present invention.

FIG. 1C is an exploded cross-sectional view of the external connector 20 according to the embodiment of the present invention. FIG. 1C also shows the bus bar 30 and the screw 32 together with the external connector 20.

The external connector 20 includes an external connection terminal 25 and a nut 40 provided on the bottom surface side of the external connection terminal 25. The external connection terminal 25 includes a conductor 60, a first metal layer 71 provided on an upper surface 62 of the conductor 60, a second metal layer 72 provided on the first metal layer 71, and a bottom surface metal layer 73 provided on a bottom surface 64 of the conductor 60. In other words, in the external connection terminal 25, the outer surface of the second metal layer 72 corresponds to a fastening surface with the bus bar 30, and the outer surface of the bottom surface metal layer 73 corresponds to a fastening surface with the nut 40. In addition, the external connection terminal 25 has a screw hole 28 provided through the external connection terminal 25.

The external connection terminal 25 of the present example may be flat in the XY plane, or may have a shape that convexly curves toward the upper surface side of the external connection terminal 25. When the external connection terminal 25 has a convexly curved shape, at the time of external connection, the bus bar 30 comes into contact with the second metal layer 72 in the peripheral region of the screw hole 28, and the nut 40 comes into contact with the bottom surface metal layer 73 at an end portion 44 described later. For example, the convexly curved external connection terminal 25 has a maximum radius of a curvature of 200 μm.

The conductor 60 is formed of a conductive material. For example, the conductor 60 includes copper or copper alloy. The conductor 60 may be formed from a plate material containing copper or copper alloy.

The conductor 60 is set to a thickness having sufficient resistance against buckling due to the tightening torque from the nut 40 and the screw head 34. In addition, the conductor 60 is set to a thickness that can sufficiently transmit a current from the external connection terminal 25 to the semiconductor module 100. As an example, the thickness from the upper surface 62 to the bottom surface 64 of the conductor 60 is 1.0 mm or greater and 7.0 mm or less.

As described above, the thickness of the conductor 60 is set according to the rigidity and conductivity of the material selected as the conductor 60. When another material is used for the conductor 60, the conductor 60 may be set to have a different thickness depending on the physical properties of the material used.

The first metal layer 71 is formed of a material having high hardness. The first metal layer 71 has a higher hardness than the second metal layer 72. As an example, the first metal layer 71 is a glossy nickel plating layer formed mainly from nickel. When nickel plating is used, plating that is resistant to dirt, elementally stable, resistant to corrosion, has high hardness, and not easily damaged can be provided at a low cost. The first metal layer 71 of the present example entirely covers the upper surface 62 of the conductor 60. As an example, the first metal layer 71 has a thickness of 0.1 μm or more and 10 μm or less.

The second metal layer 72 constitutes a fastening surface with the bus bar 30 on the upper surface side of the external connection terminal 25. The second metal layer 72 of the present example is formed of a material having a lower hardness than the first metal layer 71. As an example, the second metal layer 72 is a gold layer, a dull nickel layer, a copper tin alloy layer, or a silver layer. Thereby, the contact resistance between the external connection terminal 25 and the bus bar 30 can be lowered at the time of external connection. The second metal layer 72 of the present example entirely covers the upper surface of the first metal layer 71. As an example, the second metal layer 72 has a thickness of 0.1 μm or more and 10 μm or less.

The bottom surface metal layer 73 forms a nut surface on the bottom surface side of the external connection terminal 25. The bottom surface metal layer 73 is formed from the same material as the first metal layer 71. Therefore, the bottom surface metal layer 73 has a higher hardness than the second metal layer 72. The bottom surface metal layer 73 of the present example entirely covers the bottom surface 64 of the conductor 60. As an example, the bottom surface metal layer 73 is a glossy nickel plating layer formed mainly from nickel.

The bottom surface metal layer 73 is set to a thickness that can accommodate the cutting in of the nut 40 at the time of external connection. The bottom surface metal layer 73 has a thickness that is equal to or greater than that of the first metal layer. As an example, the bottom surface metal layer 73 has a thickness of 0.1 μm or more and 10 μm or less. Preferably, the bottom surface metal layer 73 has a thickness of 1 μm to 3 μm.

Hereinafter, metal layers applicable to the first metal layer 71, the second metal layer 72, and the bottom surface metal layer 73 will be described. Each metal layer can be formed by a known plating method. Each metal layer may contain unavoidable impurities in addition to the additives described below.

(1) Glossy nickel layer. The glossy nickel layer in the present example may be a glossy nickel plating layer. For example, the glossy nickel plating layer is formed by electrolytic plating. Electrolytic plating includes a cleaning process, a base plating process with a film thickness of 0.5 μm or less, a plating process, and a cleaning process.

As an example, the plating solution includes nickel sulfate, nickel chloride, and boric acid as main components, and includes as additives, a primary brightener including sulfur-based components such as saccharin and sodium naphthalene disulfonate, and a secondary brightener including an unsaturated alcohol component such as butynediol, propargyl alcohol, and coumarin. The hardness of the film can be adjusted by a brightener and has an HV (Vickers hardness) value of 400 to 600.

(2) Dull nickel layer. The dull nickel layer in the present example may be a matte nickel plating layer. In general, the dull nickel plating layer is different from the glossy nickel plating layer in that the dull nickel plating layer is formed with a plating solution containing no brightener. It is noted that instead of a general dull nickel layer, a semi-gloss nickel plating layer formed with a plating solution containing a small amount of a brightener may be applied. In this case, the hardness of the film can be adjusted to an HV (Vickers hardness) value of 200 to 300 by the brightener.

(3) Copper tin alloy layer. The copper tin alloy layer of the present example may be formed by heat treatment of the laminated copper layer and tin layer. The copper layer and the tin layer may be formed on the dull nickel plating layer in order from the base material side. The base dull nickel plating layer is formed as described above. The copper plating layer is a plating layer of copper cyanide, copper sulfate, or copper pyrophosphate. The tin plating layer is formed by an alkaline bath, a methanesulfonic acid bath, a sulfuric acid bath, or a neutral bath (carboxylic acid bath).

After the plating, heat treatment is performed at 150 to 200° C. for 1 hour to form a copper tin alloy plating layer. The hardness of the film has an HV value of 300 to 600, and the maximum film thickness is dull nickel/copper/tin=2 μm/0.3 μm/0.5 μm.

(4) Gold layer. The gold layer in the present example may be a gold plating layer. For example, the gold plating layer is formed by electroless plating. The plating solution is an alkaline bath mainly composed of potassium gold cyanide as a source of gold ions. Alternatively, the plating solution may be an acidic bath mainly composed of citric acid or phosphoric acid. A small amount of cobalt is added to the plating solution as a film adjusting additive. A glossy nickel plating layer may be used as a base for the gold plating layer.

The hardness of the film has an HV value of 70 to 200, and the maximum film thickness is glossy nickel/gold=3.0 μm/0.1 μm.

(5) Silver layer. The silver layer in the present example may be a silver plating layer. For example, the silver plating layer is formed by electroless plating. The plating solution contains silver potassium cyanide $KAg(CN)_2$ as a main component, and further contains free potassium cyanide KCN or sodium cyanide NaCN, potassium carbonate $K_2CO_3$, potassium hydroxide KOH, a brightener, and a hardener.

The film forming process includes steps in the order of alkali degreasing, water washing, chemical polishing, water washing, acid washing, water washing, neutralization, water washing, copper strike, water washing, silver strike, water washing (may be omitted), silver plating, water washing, anti-discoloration (may be omitted), and hot air drying.

The hardness of the film has an HV value of 70 to 200, and the maximum film thickness is glossy nickel/silver=3.0 μm/2.0 μm.

It is noted that the hardness (Vickers hardness) of the metal layer in the present example is determined according to the measurement conditions defined in JIS Z 2244 after each metal layer is formed on the copper plate conductor 60 (after the Cu—Sn alloy layer is heat-treated).

Examples of suitable combinations of the first metal layer 71 (the bottom surface metal layer 73) and the second metal layer 72 are as follows.

Glossy nickel layer and dull nickel layer
Glossy nickel layer and gold layer
Glossy nickel layer and silver layer
Glossy nickel layer and tin layer (HV value of tin layer=approximately 10)

The nut 40 is provided on the bottom surface side of the external connection terminal 25. The nut 40 has a nut hole 42. The nut 40 is accommodated in advance in an accommodating portion 51 having an opening, the accommodating portion 51 provided in the housing 50. The nut 40 is formed of a metal selected from alloys of iron, copper, aluminum, and the like and may be formed of reinforced plastic.

The nut 40 has the end portion 44 on the upper surface on the external connection terminal 25 side. The nut 40 comes in contact with the bottom surface metal layer 73 of the external connection terminal 25 at the end portion 44. It is preferable that the nut 40 and the bottom surface metal layer 73 are in direct contact with each other without providing another metal layer between the nut 40 and the bottom surface metal layer 73.

The outer diameter Dn of the nut 40 is equal to or less than the maximum diameter Ds of the screw 32. For example, the outer diameter Dn of the nut 40 is the outer diameter of the upper surface that comes in contact with the external connection terminal 25 at the time of external connection. For example, the outer diameter Dn of the nut 40 is equal to or less than the outer diameter of the screw head 34. In other words, at the time of external connection, the nut 40 is entirely covered by the screw 32 in a top view.

Figure 1D:
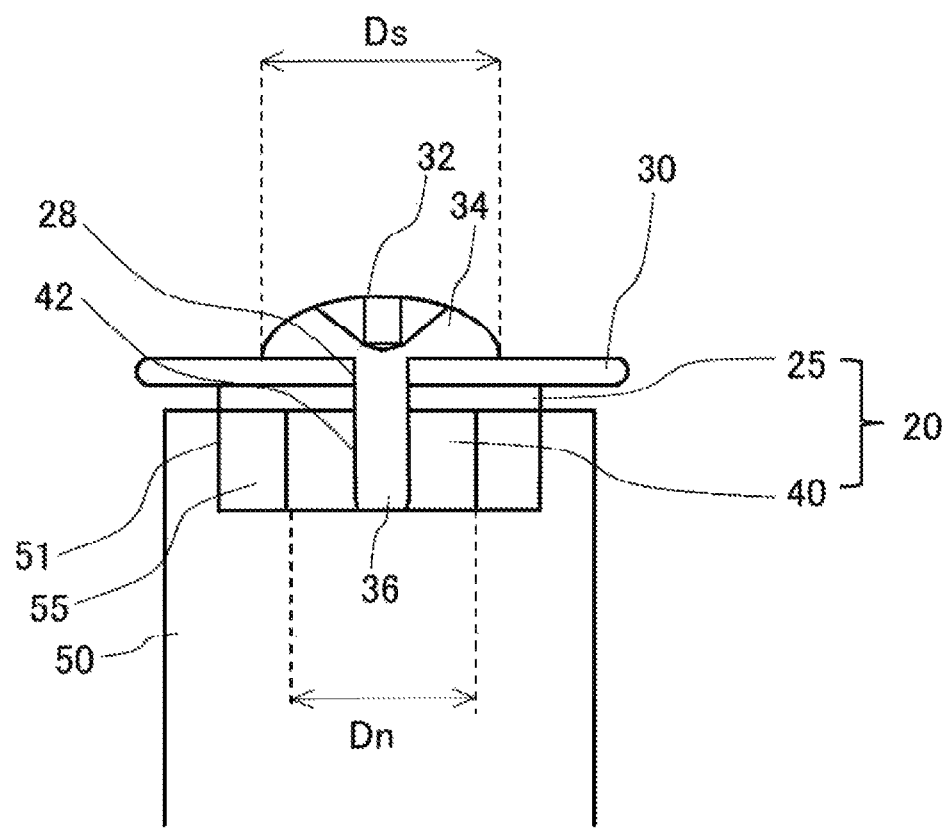
FIG. 1D is a cross-sectional view of the external connector 20 according to the embodiment of the present invention.
Figure 1D:
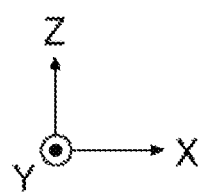

FIG. 1D is a cross-sectional view of the external connector 20 according to the embodiment of the present invention. FIG. 1D is an example of the A-A' cross-sectional view (XZ plane cross-sectional view) of FIG. 1B.

At the time of external connection, the external connection terminal 25 is disposed on the upper surface side of the nut 40, and then the bus bar 30 is disposed on the upper surface side of the external connection terminal 25. Here, the external connection terminal 25 and the bus bar 30 are arranged such that the hole of the bus bar 30, the screw hole 28 of the external connection terminal 25, and the nut hole 42 of the nut 40 are concentric when viewed from the top view.

It is noted that the nut 40 of the present example is resin-sealed with a resin 55 and fixed to the accommodating portion 51 of the housing 50. The material of the resin 55 is not limited as long as it is a material that can be solidified at room temperature and fix the position of the nut 40. The nut 40 may be fitted or embedded in the accommodating portion 51 so that the nut 40 does not rotate, without providing the resin 55.

In addition, the nut 40 may be integrated with the housing 50. As an example, the nut 40 is integrally formed (insert molding) with the housing 50. The depth at which the nut 40 is fixed is determined in accordance with the overall design of the semiconductor module 100 such as the length of the screw 32.

The thread portion 36 of the screw 32 passes through the screw hole 28 of the bus bar 30 and the external connection terminal 25 and is tightened into the nut hole 42 of the nut 40, whereby the screw 32 fastens the bus bar 30 and the external connector 20 together.

After the external connection terminal 25 and the bus bar 30 are disposed, the screw 32 is tightened, and the bus bar 30 and the external connector 20 are tightened together. When the screw 32 is tightened, the bus bar 30 and the second metal layer 72 come into contact with each other. The second metal layer 72 of the present example is formed of a material with low hardness such as dull nickel. For this reason, the contact resistance of the bus bar 30 fastening surface of the external connection terminal 25 is low, and no gap is formed between the bus bar 30 and the external connection terminal 25 when the screw 32 is tightened. As a result, the bus bar 30 and the external connection terminal 25 can be sufficiently adhered at the time of external connection.

On the other hand, when the screw 32 is tightened, a tightening torque is applied to the nut 40. Here, if the bottom surface metal layer is soft, the end portion 44 of the nut 40 slides on the bottom surface metal layer and is not sufficiently supported by the external connection terminal 25, and the tightening torque load by the nut 40 increases. As a result, the tightening torque applied to the resin 55 that holds the nut 40 also increases, which may cause a crack.

The bottom surface metal layer 73 in the present example is formed of a material having high hardness such as nickel. Therefore, when the screw 32 is tightened, the end portion 44 of the nut 40 can cut into the bottom surface metal layer 73 and can receive a tightening torque by the nut 40 and the external connection terminal 25, so that the rotation of the nut 40 can be prevented.

In addition, as described above, the external connection terminal 25 of the present example may have a shape that convexly curves toward the upper surface side of the external connection terminal 25, and with respect to the convexly curved external connection terminal 25, the end portion 44 of the nut 40 can easily come in contact with the bottom surface metal layer 73. Furthermore, the outer diameter Dn of the nut 40 is equal to or less than the maximum diameter Ds of the screw 32. Therefore, when the screw 32 is tightened, the entire upper surface of the nut 40 is pressed by the screw head 34, and the end portion 44 of the nut 40 can reliably cut into the bottom surface metal layer 73.

Figure 2:
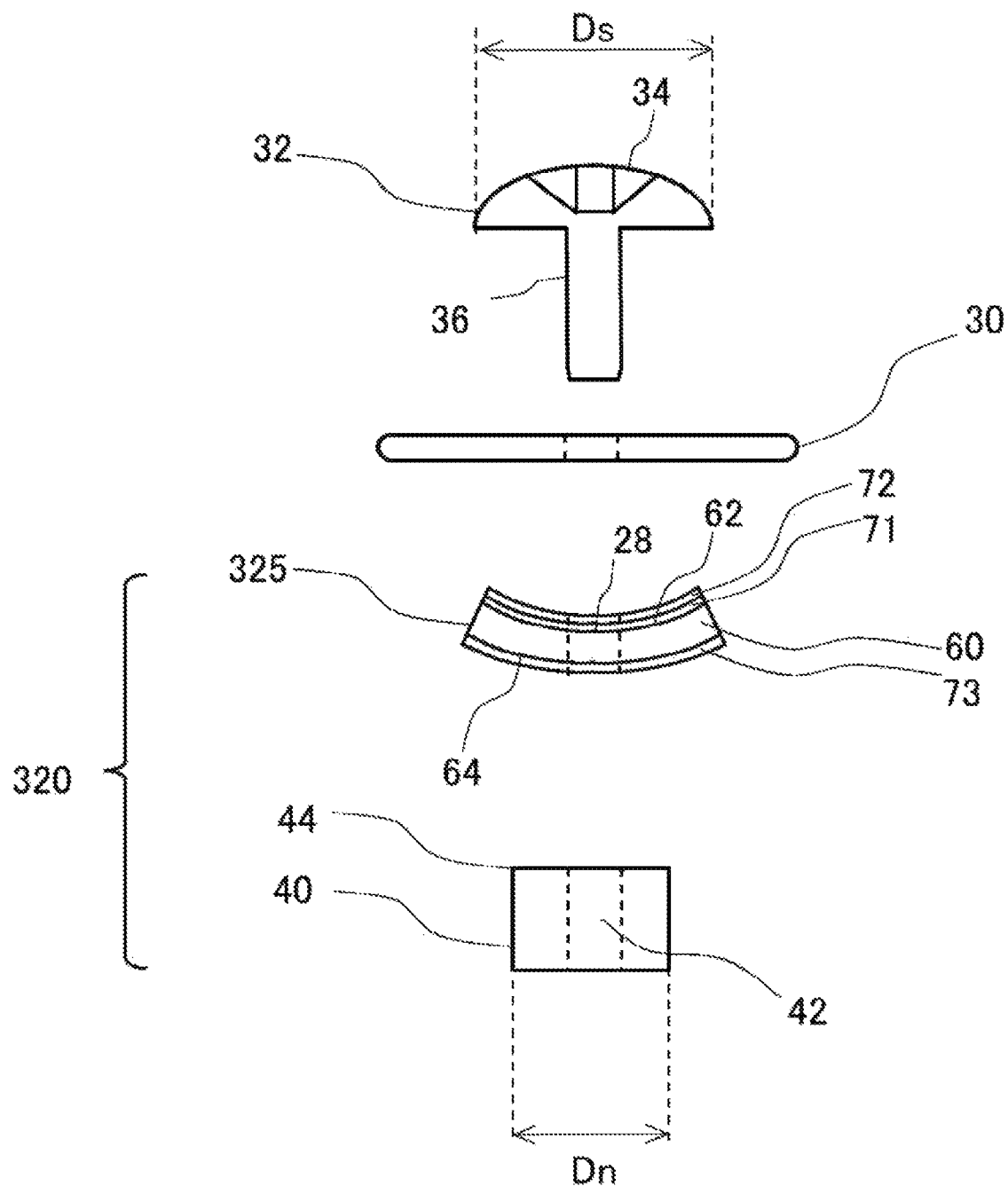
FIG. 2 is cross-sectional view of an external connector 320 according to a reference example.

FIG. 2 is an exploded cross-sectional view of an external connector 320 according to a reference example. It is noted that in FIG. 2, the same or similar reference numerals are given to components common to the external connector 20 described in FIGS. 1A to 1D.

In FIG. 2, an external connection terminal 325 has a shape that concavely curves toward the upper surface side of the external connection terminal 325 in the XY plane. Therefore, at the time of external connection, the bus bar 30 comes in contact with the extensions of the second metal layer 72 protruding to the upper surface side, and the nut 40 comes in contact with the bottom surface metal layer 73 in the peripheral region of the screw hole 28. Therefore, the end portion 44 of the nut 40 may not be in sufficient contact with the external connection terminal 325 or may be separated from the external connection terminal 325.

As described above, the bottom surface metal layer 73 is formed of a material having high hardness. Therefore, if the end portion 44 of the nut 40 and the bottom surface metal layer 73 are not sufficiently in contact, the end portion 44 of the nut 40 does not sufficiently cut into the bottom surface metal layer 73 when the screw 32 is tightened. As a result, a tightening torque is applied to the resin 55 holding the nut 40, which may cause a crack.

As described above, the external connector 320 according to the reference example cannot come in close contact with the bus bar 30 and the external connection terminal 25 like the external connector 20 according to the embodiment of the present invention, and cannot sufficiently perform external connection.

Figure 3:
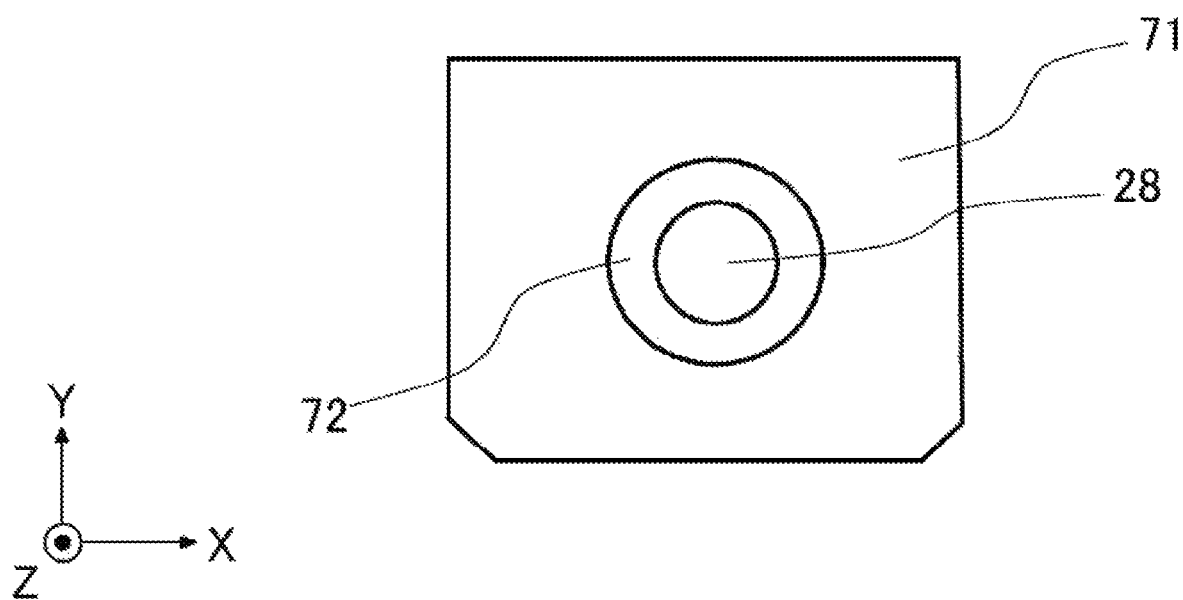
FIG. 3 is a top view showing another example of the external connector 20 according to the embodiment of the present invention.

FIG. 3 is a top view showing another example of the external connector 20 according to the embodiment of the present invention. Specifically, FIG. 3 is a top view of the external connector 25. It is noted that in FIG. 3, the same or similar reference numerals are given to components common to the external connector 20 described in FIGS. 1A to 1D.

In FIG. 3, the first metal layer 71 is provided so as to entirely cover the upper surface 62 of the conductor 60, but the second metal layer 72 is provided so as to cover a part of the first metal layer 71. The second metal layer 72 of the present example covers the peripheral region of the screw hole 28 of the first metal layer 71 concentrically with the screw hole 28.

The region where the second metal layer 72 is provided is set according to the rigidity of the material used for the second metal layer 72, so that the bus bar 30 and the external connector 25 are sufficiently in close contact with each other at the time of external connection. As an example, the second metal layer 72 may be provided in a region corresponding to a range occupied by the screw head 34 in a top view at the time of external connection.

By providing the second metal layer 72 so as to cover only a part of the first metal layer 71, the cost can be suppressed as compared with the case where the first metal layer 71 is entirely covered.

Figure 4:
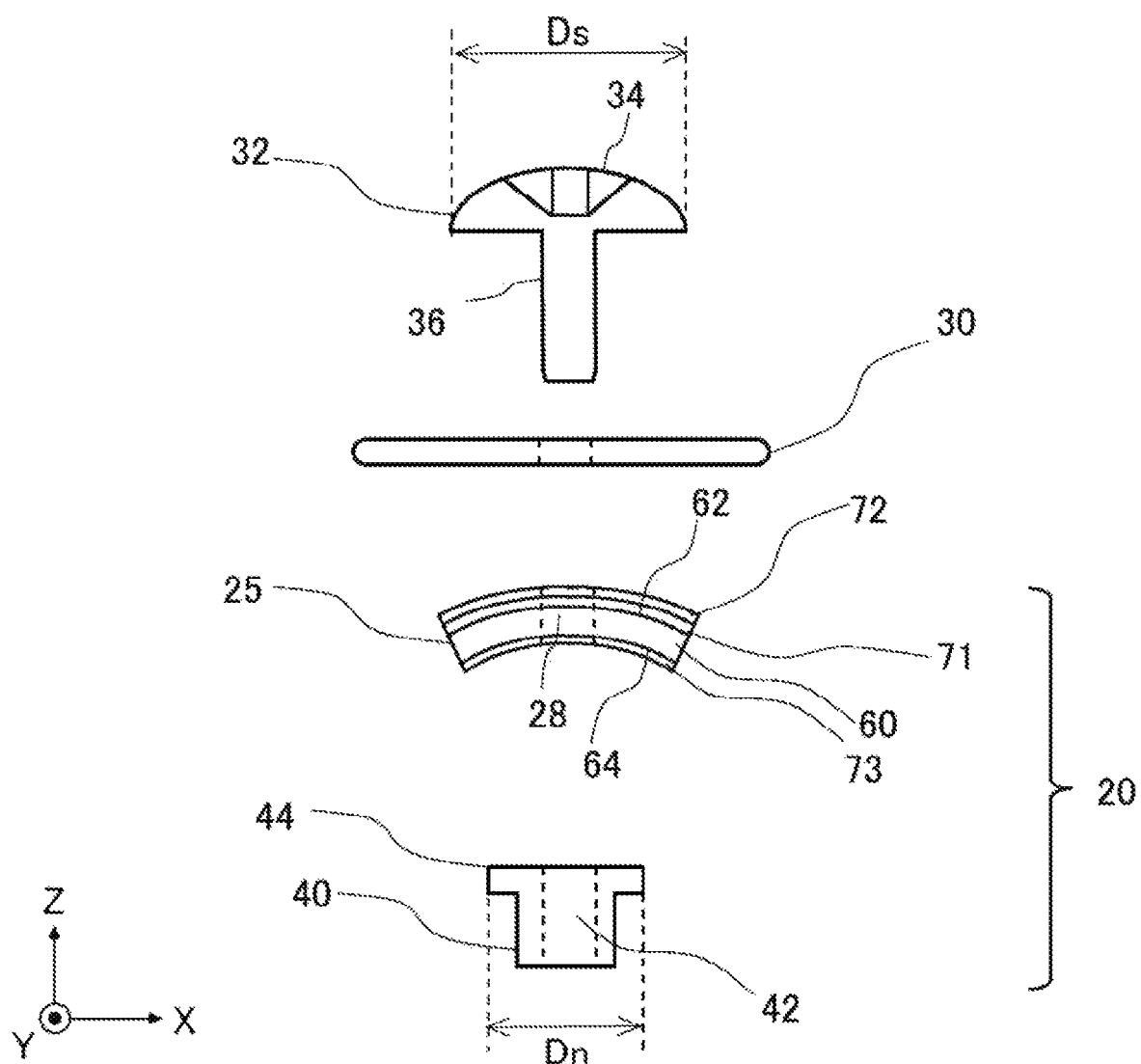
FIG. 4 is an exploded cross-sectional view showing still another example of the external connector 20 according to the embodiment of the present invention.

FIG. 4 is an exploded cross-sectional view showing still another example of the external connector 20 according to the embodiment of the present invention. It is noted that in FIG. 4, the same or similar reference numerals are given to components common to the external connector 20 described in FIGS. 1A to 1D.

As shown in FIG. 4, the nut 40 of the present example is a flange-type nut having a flange on the external connection terminal 25 side. In this case, the outer diameter Dn of the nut 40 corresponds to the outer diameter of the flange, and the outer diameter of the flange is equal to or less than the outer diameter of the screw head 34. By using a flange-type nut as the nut 40, it is easy to apply torque to the nut 40 when the screw 32 is tightened. Therefore, the rotation of the nut 40 can be reliably prevented.

Figure 5:
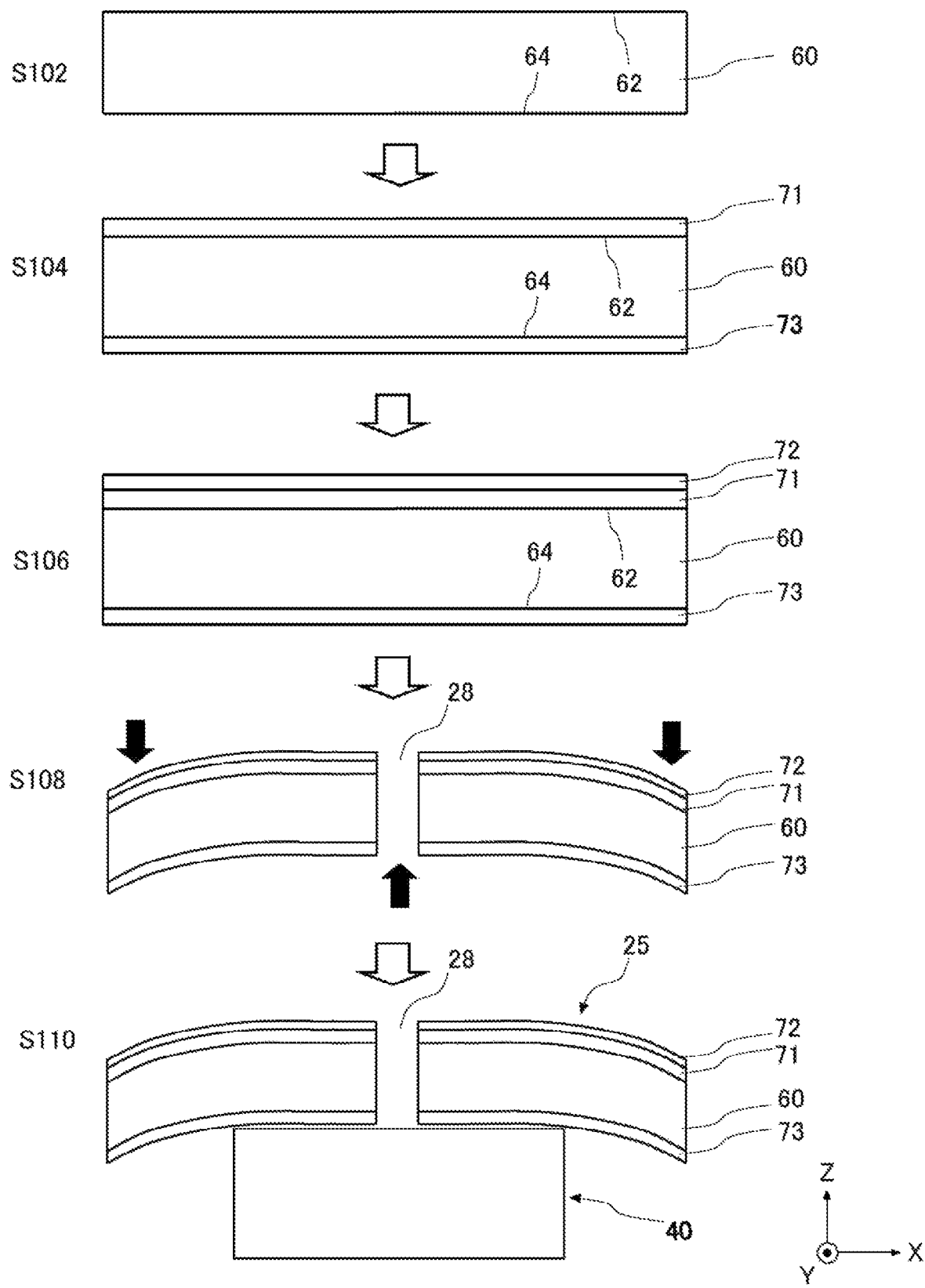
FIG. 5 is an explanatory diagram showing a method for manufacturing the external connector 20 according to the embodiment of the present invention.

FIG. 5 is an explanatory diagram showing a method for manufacturing the external connector 20 according to the embodiment of the present invention. The manufacturing method of the present example includes steps S102 to S110.

In step S102, the conductor 60 having the upper surface 62 and the bottom surface 64 is provided. As an example, the conductor 60 is formed from copper.

In step S104, the first metal layer 71 is provided on the upper surface 62 of the conductor 60. In addition, the bottom surface metal layer 73 is provided on the bottom surface 64 of the conductor 60. For example, the first metal layer 71 and the bottom surface metal layer 73 are provided simultaneously by immersing the conductor 60 in a plating solution. The first metal layer 71 and the bottom surface metal layer 73 may be nickel plating.

In step S106, the second metal layer 72 is provided on the first metal layer 71. For example, the second metal layer 72 is provided on the first metal layer 71 by masking the bottom surface 64 of the conductor 60 and immersing the conductor 60 in a plating solution. The second metal layer 72 may be any of gold, dull nickel, copper tin alloy plating, or silver plating.

The external connection terminal 25 is provided by steps S102 to S106.

In step S108, the external connection terminal 25 is processed into a shape that convexly curves toward the upper surface side. The external connection terminal 25 of the present example is disposed in a mold and is pressed in the direction indicated by the black arrows in FIG. 5, that is, the extensions in the XY plane are pressed from the top to the bottom, and the center is pressed from the bottom to the top, thereby processing the external connection terminal 25 into a convexly curved shape. Furthermore, in step S108, the screw hole 28 is formed by simultaneously punching and blanking the external connection terminal 25.

In step S110, the nut 40 is provided on the bottom surface side of the external connection terminal 25. For example, the external connection terminal 25 is disposed on the nut 40 that has been accommodated in the accommodating portion 51 of the housing 50 in advance, so that the screw hole 28 and the nut hole 42 are concentric.

Figure 6:
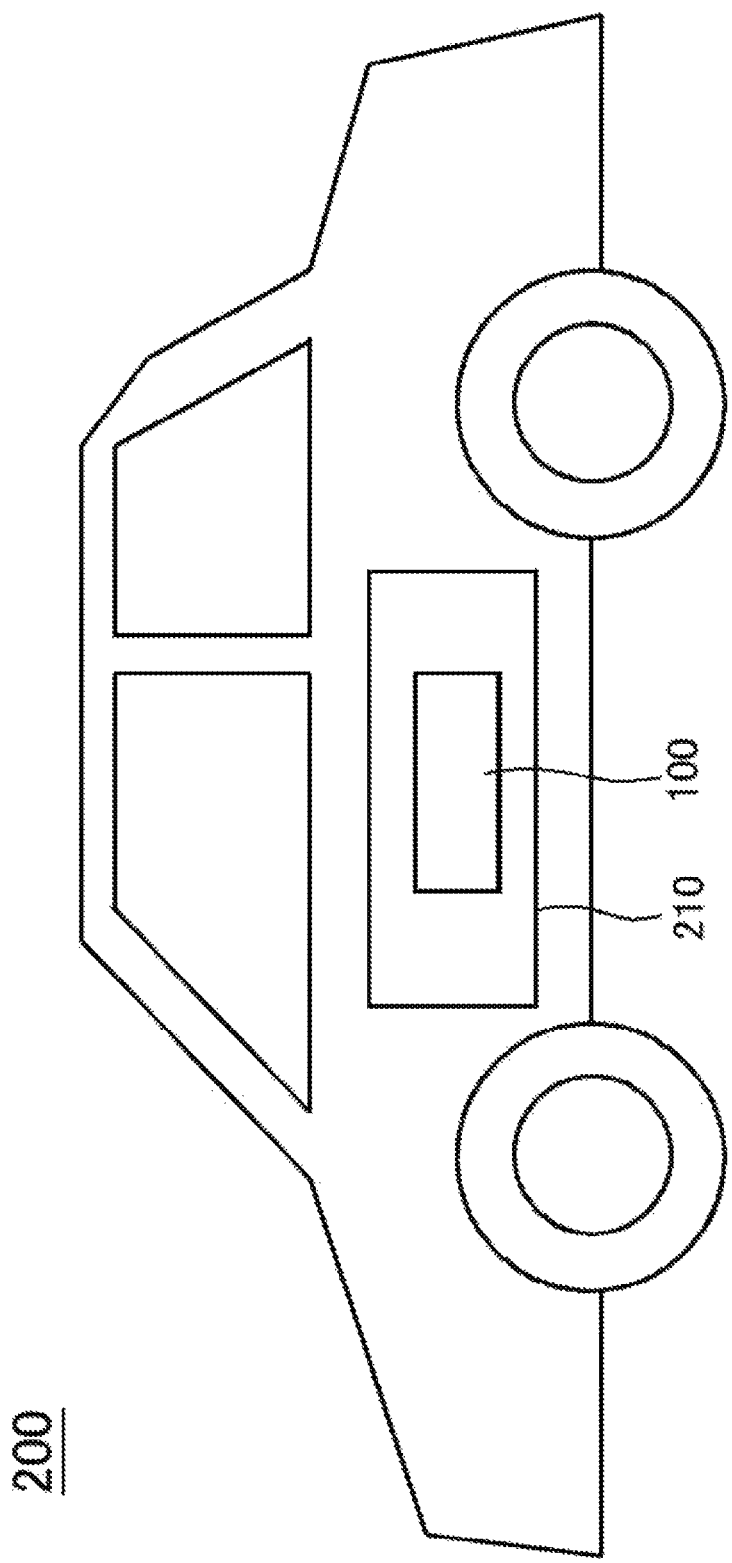
FIG. 6 is a schematic diagram of a vehicle 200 according to the embodiment of the present invention.

FIG. 6 is a schematic diagram of a vehicle 200 according to the embodiment of the present invention. The vehicle 200 is a vehicle that generates at least a part of propulsive force using electric power. As an example, the vehicle 200 is an electric vehicle that generates all propulsive force with a power driving device such as a motor, or a hybrid vehicle that uses a power driving device such as a motor and an internal combustion engine that is driven by fuel such as gasoline.

The vehicle 200 includes a control device 210 (external device) that controls the power driving device such as the motor. The control device 210 is provided with the semiconductor module 100. The semiconductor module 100 may control the power supplied to the power driving device.

Figure 7:
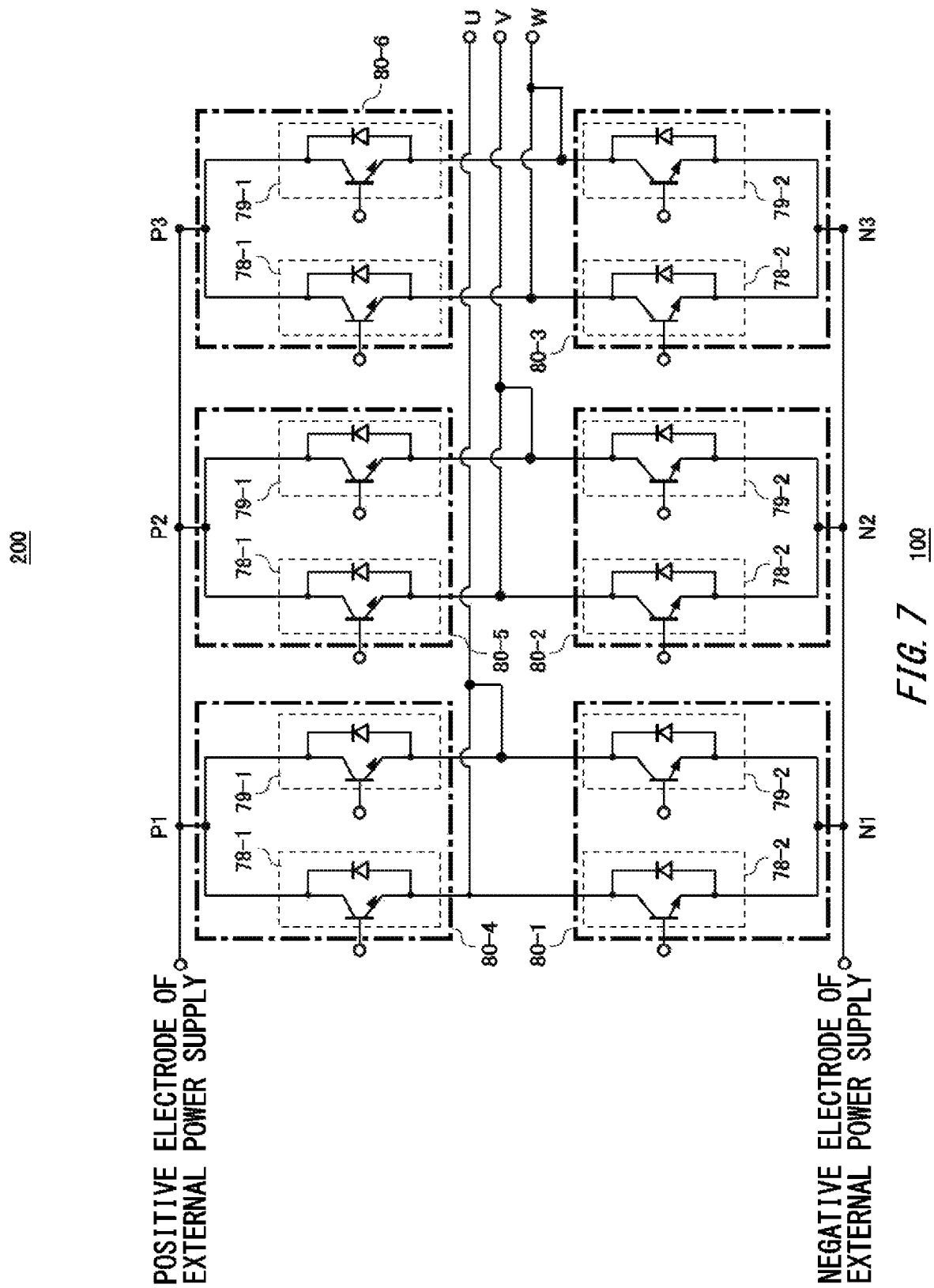
FIG. 7 is a main circuit diagram of the semiconductor module 100 according to the embodiment of the present invention.

FIG. 7 is a main circuit diagram of the semiconductor module 100 according to the embodiment of the present invention. The semiconductor module 100 may be a part of a vehicle-mounted unit that drives a vehicle motor. The semiconductor module 100 may function as a three-phase AC inverter circuit having input terminals P and N and output terminals U, V, and W.

A semiconductor chip in which a first semiconductor chip 78 and a second semiconductor chip 79 are connected in parallel is referred to as a semiconductor chip 80. A semiconductor chip 80-1, a semiconductor chip 80-2, and a semiconductor chip 80-3 may constitute a lower arm in the semiconductor module 100. A semiconductor chip 80-4, a semiconductor chip 80-5, and a semiconductor chip 80-6 may constitute an upper arm in the semiconductor module 100. The pair of semiconductor chips 80-1 and 80-4 may constitute a leg. The pair of semiconductor chips 80-2 and 80-5 may constitute a leg. The pair of semiconductor chips 80-3 and 80-6 may constitute a leg.

In the semiconductor chip 80-1, the emitter electrodes of a first semiconductor chip 78-2 and a second semiconductor chip 79-2 may be electrically connected to the input terminal N1, and the collector electrodes of a first semiconductor chip 78-2 and a second semiconductor chip 79-2 may be electrically connected to the output terminal U. In the semiconductor chip 80-4, the emitter electrodes of a first semiconductor chip 78-1 and a second semiconductor chip 79-1 may be electrically connected to the output terminal U, and the collector electrodes of a first semiconductor chip 78-1 and a second semiconductor chip 79-1 may be electrically connected to the input terminal P1.

In the semiconductor chip 80-2, the emitter electrodes of the first semiconductor chip 78-2 and the second semiconductor chip 79-2 may be electrically connected to the input terminal N2, and the collector electrodes of the first semiconductor chip 78-2 and the second semiconductor chip 79-2 may be electrically connected to the output terminal V. In the semiconductor chip 80-5, the emitter electrodes of the first semiconductor chip 78-1 and the second semiconductor chip 79-1 may be electrically connected to the output terminal V, and the collector electrodes of the first semiconductor chip 78-1 and the second semiconductor chip 79-1 may be electrically connected to the input terminal P2.

In the semiconductor chip 80-3, the emitter electrodes of the first semiconductor chip 78-2 and the second semiconductor chip 79-2 may be electrically connected to the input terminal N3, and the collector electrodes of the first semiconductor chip 78-2 and the second semiconductor chip 79-2 may be electrically connected to the output terminal W. In the semiconductor chip 80-6, the emitter electrodes of the first semiconductor chip 78-1 and the second semiconductor chip 79-1 may be electrically connected to the output terminal W, and the collector electrodes of the first semiconductor chip 78-1 and the second semiconductor chip 79-1 may be electrically connected to the input terminal P3.

The semiconductor chips 80-1 to 80-6 may each be alternately switched by signals input to the control electrode pads of the first semiconductor chip 78 and the second semiconductor chip 79. In the present example, the first semiconductor chip 78 and the second semiconductor chip 79 may generate heat during switching.

The input terminals P1, P2, and P3 may be connected to the positive electrode of the external power supply via the bus bar 30. The input terminals N1, N2, and N3 may be connected to the negative electrode of an external power supply via the bus bar 30. The input terminals P1, P2, and P3 may be electrically connected to each other. The input terminals N1, N2, and N3 may be electrically connected to each other. The output terminals U, V, and W may each be connected to a load via the bus bar 30, respectively.

In the semiconductor module 100, the first semiconductor chip 78 and the second semiconductor chip 79 may each be an RC-IGBT (Reverse Conducting IGBT) semiconductor chip. In the RC-IGBT semiconductor chip, the IGBT and FWD may be connected in antiparallel. The first semiconductor chip 78 and the second semiconductor chip 79 may each include a combination of a transistor such as a MOSFET or IGBT and a diode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10. Semiconductor cell, 12. Semiconductor chip, 20. External connector, 25. External connection terminal, 28. Screw hole, 30. Bus bar, 32. Screw, 34. Screw head, 36. Thread portion, 40. Nut, 42. Nut hole, 44. End portion, 50. Housing, 51. Accommodating portion, 55. Resin, 60. Conductor, 62. Upper surface, 64. Bottom surface, 71. First metal layer, 72. Second metal layer, 73. Bottom surface metal layer, 78. First semiconductor chip, 79. Second semiconductor chip, 80. Semiconductor chip, 90. Bottom plate, 92. Insulating plate, 94. Circuit layer, 93. Conductive member, 100. Semiconductor module, 200. Vehicle, 210. Control device, 320. External connector, 325. External connection terminal

What is claimed is:

1. An external connector of a semiconductor module, comprising:
   an external connection terminal having a shape that convexly curves toward an upper surface side; and
   a nut provided on a bottom surface side of the external connection terminal, wherein
   the external connection terminal has
   a conductor,
   a first metal layer provided on an upper surface of the conductor,
   a second metal layer provided on the first metal layer, and
   a bottom surface metal layer provided on a bottom surface of the conductor;
   wherein the conductor is formed of a first metal and the bottom surface metal layer is formed of a second metal different than the first metal, the second metal of the bottom surface metal layer disposed directly on the metal of the conductor without an intervening material therebetween; and wherein the conductor has a thickness that is 1.0 mm or more and 7.0 mm or less, the first metal layer has a thickness that is 0.1 μm or more and 10 μm or less, the second metal layer has a thickness that is 0.1 μm or more and 10 μm or less, and the bottom surface metal layer has a thickness that is 0.1 μm or more and 10 μm or less.

2. The external connector according to claim 1, wherein the first metal layer has a higher hardness than the second metal layer.

3. The external connector according to claim 1, wherein the first metal layer is formed of a same material as the bottom surface metal layer.

4. The external connector according to claim 1, wherein the conductor is formed of copper or copper alloy,
the first metal layer and the bottom surface metal layer are glossy nickel layers, and
the second metal layer is a gold layer, a dull nickel layer, a copper tin alloy layer, or a silver layer.

5. The external connector according to claim 1, wherein the second metal layer is provided so as to cover a part of the first metal layer.

6. The external connector according to claim 1, wherein an outer diameter of the nut is equal to or less than a maximum diameter of a screw that corresponds to the nut.

7. The external connector according to claim 1, wherein the nut is integrated with a housing of the semiconductor module.

8. The external connector according to claim 1, wherein the nut is a flange-shaped nut having a flange on the external connection terminal side.

9. A manufacturing method for an external connector of a semiconductor module, comprising:
providing an external connection terminal having a shape that convexly curves toward an upper surface side; and
providing a nut on a bottom surface side of the external connection terminal, wherein
providing the external connection terminal includes:
providing a conductor;
providing a first metal layer on an upper surface of the conductor;
providing a second metal layer on the first metal layer; and
providing a bottom surface metal layer on a bottom surface of the conductor;
wherein the conductor is formed of a first metal and the bottom surface metal layer is formed of a second metal different than the first metal, the second metal of the bottom surface metal layer disposed directly on the metal of the conductor without an intervening material therebetween; and
wherein
the conductor has a thickness that is 1.0 mm or more and 7.0 mm or less,
the first metal layer has a thickness that is 0.1 μm or more and 10 μm or less,
the second metal layer has a thickness that is 0.1 μm or more and 10 μm or less, and
the bottom surface metal layer has a thickness that is 0.1 μm or more and 10 μm or less.

10. The manufacturing method according to claim 9, wherein
providing the external connection terminal includes forming an external connection terminal having a shape that convexly curves toward an upper surface side.

11. A semiconductor module, comprising:
the external connector according to claim 1.

12. A vehicle, comprising:
the semiconductor module according to claim 11.

13. A method for connecting the external connector according to claim 1 to a bus bar, comprising:
disposing the bus bar on an upper surface side of the external connection terminal;
inserting a thread portion of a screw through a hole of the bus bar and a screw hole of the external connection terminal; and
causing an end portion of the nut to cut into the bottom surface metal layer by tightening the screw.

14. An external connector of a semiconductor module, comprising:
an external connection terminal; and
a nut provided on a bottom surface side of the external connection terminal, wherein
the external connection terminal has
a conductor,
a first metal plating layer provided on an upper surface of the conductor,
a second metal layer provided on the first metal plating layer,
a bottom surface plating metal layer provided on a bottom surface of the conductor, and
a screw hole extending through the second metal layer, the first metal plating layer, the conductor, and the bottom surface plating metal layer, the screw hole structured to accommodate a screw to electrically connect a bus bar of the semiconductor module;
wherein
the first metal plating layer and the bottom surface plating metal layer are formed of a same plating material;
the first metal plating layer has a higher hardness than the second metal layer;
the external connection terminal has a shape that curves toward the bus bar or the nut when the connection terminal is connected to the semiconductor module; and
the conductor is formed of a first metal and the bottom surface plating metal layer is formed of a second metal different than the first metal, the second metal of the bottom surface plating metal layer disposed directly on the metal of the conductor without an intervening material therebetween;
wherein
the conductor has a thickness that is 1.0 mm or more and 7.0 mm or less,
the first metal plating layer has a thickness that is 0.1 μm or more and 10 μm or less,
the second metal layer has a thickness that is 0.1 μm or more and 10 μm or less, and
the bottom surface plating metal layer has a thickness that is 0.1 μm or more and 10 μm or less.

* * * * *